United States Patent [19]

Schulze et al.

[11] Patent Number: 5,420,045
[45] Date of Patent: May 30, 1995

[54] PROCESS FOR MANUFACTURING THYRISTOR WITH ADJUSTABLE BREAKOVER VOLTAGE

[75] Inventors: Hans-Joachim Schulze, Ottobrunn; Heinz Mitlehner; Frank Pfirsch, both of München, all of Germany

[73] Assignee: Siemens Aktiengesellschaft, Munich, Germany

[21] Appl. No.: 122,413

[22] Filed: Sep. 27, 1993

[30] Foreign Application Priority Data

Mar. 27, 1991 [DE] Germany .................... 41 10 099.9

[51] Int. Cl.⁶ .......................................... H01L 29/74
[52] U.S. Cl. ............................... 437/6; 437/931; 257/173
[58] Field of Search ................. 437/6, 24, 931; 257/114, 115, 157, 159, 162–167, 173, 175, 176, 617

[56] References Cited

U.S. PATENT DOCUMENTS

| 4,278,475 | 7/1981 | Bartko et al. ................. 148/1.5 |
| 4,497,109 | 2/1985 | Huber et al. .................. 29/578 |
| 4,987,087 | 1/1991 | Voss ........................... 437/6 |
| 5,049,965 | 9/1991 | Schulze et al. ................ 357/38 |
| 5,243,205 | 9/1993 | Kitagawa ...................... 257/173 |

FOREIGN PATENT DOCUMENTS

| 0316881 | 5/1989 | European Pat. Off. . |
| 0343369 | 11/1989 | European Pat. Off. . |
| 0423721 | 4/1991 | European Pat. Off. . |
| 2144581 | 2/1973 | France . |
| 7124728 | 2/1973 | France . |
| 3151138 | 7/1982 | Germany . |
| 59-217366 | 12/1984 | Japan . |
| 61-202465 | 9/1986 | Japan . |

OTHER PUBLICATIONS

"Laser Trimming of Thyristors to Add an Overvoltage Self-Protected Turn-On Feature"; 16th Annual IEEE Power Electronics Specialists Conference, Jun. 24–28, 1985, pp. 463–468.

Primary Examiner—Olik Chaudhuri
Assistant Examiner—S. Mulpuri
Attorney, Agent, or Firm—Hill, Steadman & Simpson

[57] ABSTRACT

Thyristor with an npnp layer sequence, in which a zone (14) enriched with generation and recombination centers and formed by proton irradiation is provided underneath the triggering contact (7) in the n-type base (3), which enriched zone defines, by means of its distance (d) from the cathode-end main surface (15), a reduced breakover voltage at which a controllable overhead triggering of the thyristor occurs.

4 Claims, 2 Drawing Sheets

PROCESS FOR MANUFACTURING THYRISTOR WITH ADJUSTABLE BREAKOVER VOLTAGE

The invention relates to methods for manufacturing a thyristor having an adjustable breakover voltage.

When a voltage present between the cathode-end and anode-end electrode of a thyristor and blocking the thyristor reaches or exceeds the value of the breakover voltage, a local breakdown of the pn junction separating the p-type base from the n-type base occurs. In general the breakdown occurs at the edge of this pn junction located in the side face of the thyristor. To avoid such a local breakdown very frequently leading to the destruction of the thyristor, it is known from EP-A-0 088 967 to provide the pn junction between the p-type base and the n-type base with an indentation reducing the thickness of the n-type base layer by irradiation with a laser beam underneath the central triggering contact of the thyristor and by this means to produce a controllable breakdown which already occurs at a reduced breakover voltage in the area of the indentation. This controllable breakdown leads to overhead triggering of the thyristor in which thermal destruction is reliably prevented because of the controllable propagation of firing. The disadvantageous factor is, however, that the reduced breakover voltage cannot be set to a particular voltage value with the desired accuracy and reproducibility in this arrangement.

From EP-A-0 316 881, on the other hand, it is known to adjust the breakover voltage of a thyristor by providing a part-area of its p-type emitter, which is arranged in the lateral area of a triggering contact or of a light-sensitive thyristor zone, with a higher doping concentration than the remaining parts of the p-type Further, European Patent Application EP-A-0 343 369 A1 discloses a method for manufacturing a thyristor, whereby a breakdown voltage that is lower in one region than in the remainder of the semiconductor body of the thyristor is produced with the assistance of the local proton irradiation, whereby the proton energy is dimensioned such that the maximum of the imperfections from first base zone to second base zone and half the thickness of the second base zone.

Among other things, the patent application EP-A-0 423721 A2, which has a priority date before the date of filing of the present application but does not enjoy prior publication, discloses a method for setting the breakover voltage, whereby the number of crystal defects in a base layer is modified by varying the dose of a proton radiation in order to set the breakover voltage in a defined way.

The present invention is based on the object of specifying a thyristor of the type initially mentioned, in which the pn junction between the p-type base and n-type base breaks down in a defined manner when an adjustable reduced breakover voltage is reached without thermal destruction occurring as a result, in which arrangement the measures taken for adjusting the reduced breakover voltage can be carried out in a simple manner.

The advantage which can be achieved by means of the invention lies especially in the fact that the reduced breakover voltage at which the pn junction between the p-type base and the n-type base of the thyristor breaks down without the latter suffering damage as a result, can be adjusted with adequate accuracy and reproducibility by means of the distance of the zone provided with the generation and recombination centers from the main surface at the cathode end, which distance can be selected in a simple manner.

BRIEF DESCRIPTION OF THE DRAWINGS

In the text which follows, the invention will be explained in greater detail with reference to the drawing, in which.

DETAILED DESCRIPTION OF THE INVENTION

Figure 1:
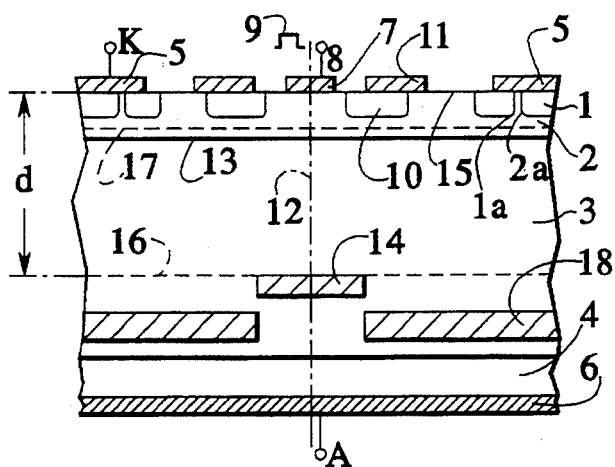
FIG. 1 shows a thyristor constructed in accordance with the invention.

FIG. 1 shows a power thyristor which exhibits a semiconductor body, for example of doped silicon, with four successive semiconductor layers of alternating types of conductivity. In detail, these consist of an n-type emitter 1, a p-type base 2, an n-type base 3 and a p-type emitter 4. The n-type emitter 1 is in contact with a cathode-end electrode 5 provided with a terminal K, the p-type emitter 4 is in contact with an anode-end electrode 6 which is provided with a terminal A. An external circuit, not shown in detail, which is connected at A and K, basically contains a voltage source which outputs, for example, a direct voltage of 1000 volts, and a load resistor connected in series with this voltage source. The anode-end electrode 6 is connected to a potential which is positive compared with K due to the voltage supplied by the voltage source so that the thyristor is in the blocked state.

A triggering contact 7, which is in contact with the p-type base 2, is provided with a terminal 8 which is supplied with a positive voltage pulse, designated by 9, in order to trigger the thyristor. If, as a result, the thyristor which is in the blocked state is switched to the current-conducting state, it closes the external circuit by means of a low-impedance connection between A and K. The thyristor is turned off, that is to say it changes from the current-conducting to the blocked state, for example, by a disconnection of the said voltage source or, if this is an alternating-voltage source, at the first zero crossing of the supplied alternating voltage occurring after the triggering.

An n-conducting region 10 inserted into the p-type base 2 is provided with a conducting coating 11 which is extended in the direction of the n-type emitter 1 to such an extent that it short circuits the pn junction between 10 and 2. The parts 10 and 11 form a so-called auxiliary emitter (amplifying gate) which represents an internal amplification of the thyristor triggering. With a rotationally symmetric structure of the thyristor, the dot-dashed line 12 is to be considered as axis of symmetry. 1a designates recesses in the n-type emitter 1 which are filled up with corresponding projections 2a of the p-type base 2. The latter are in contact with the cathode-end electrode 5. The parts 1a and 2a form emitter-base short circuits which prevent unwanted triggering of the thyristor when blocking voltages are applied.

Between the p-type base 2 and the n-type base 3, a pn junction 13 is located which is biased in the blocking direction when a blocking voltage is applied to the terminals A and K. If this blocking voltage is increased to the value of the breakover voltage, a local breakdown of the pn junction 13, which then occurs, leads to an uncontrollable triggering of the thyristor which can thermally destroy the latter.

To eliminate this risk, a zone 14 of the n-type base, which is located in the lateral area of the triggering contact 7 or, in the case of an optically triggerable thyristor, in the lateral area of a light-sensitive thyristor zone, and extends approximately in parallel with the cathode-end main surface 15, is provided with additional generation and recombination centers by masked irradiation with charged particles according to the invention. The charged particles, which preferably consist of protons or helium cores, generate defects in the semiconductor lattice which reduce the carrier life. Under the influence of the blocking voltage present across A and K, a space charge zone forms across the pn junction 13, the width of which increases with increasing blocking voltage. The distance of the zone 14 from the cathode-end main surface 15 is then selected in such a manner that when the blocking voltage has reached the value of a desired reduced breakover voltage, the lower limit of the space charge zone just coincides with the upper boundary face of the zone 14. The boundaries of the space charge zone be drawn for this value of the blocking voltage in FIG. 1, the lower boundary being designated by 16 and the upper boundary by 17. When the reduced breakover voltage is reached, the thyristor fires since the gain of the pnp transistor structure formed from the layers 4, 3 and 2 is abruptly greatly increased in the lateral area of the triggering contact 7. This occurs because the generation current in the space charge zone 16, 17 is greatly increased due to the zone 14. Thus, the coincidence of the space-charge zone boundary 16 with the zone 14 in which an increased generation and recombination of charge carriers occurs produces the overhead triggering of the thyristor. The reduced breakover voltage at which this occurs is set in a simple manner by the distance d of the zone 14 from the cathode-end main surface 15.

With a variable adjustability of the electrical thyristor data, the controllable triggering of the thyristor on reaching the reduced breakover voltage can also be secured, according to a further development of the invention, by the fact that a further zone 18 with recombination centers is additionally generated by irradiation with charged particles in the n-type base 3, which further zone is located outside the lateral area of the zone 14 and, like the latter, extends in parallel with the cathode-end main surface. The zone 18 is arranged at a greater distance from the cathode-end main surface 15 than the zone 14. Due to the zone 18, the recombination is increased in the lateral area of the n-type base 3 located outside the zone 14 which allows adjustability, for example of the on-state voltage and of the storage charge of the thyristor and also has the effect that the difference in gain of the pnp part-transistors further increases in the areas of the zone 14 and of the zone 18. The charged particles inserted into the zone 18 also consist of protons or helium cores.

However, the thyristor according to the invention according to FIG. 1 is also fully operable without the zone 18.

Figure 2:
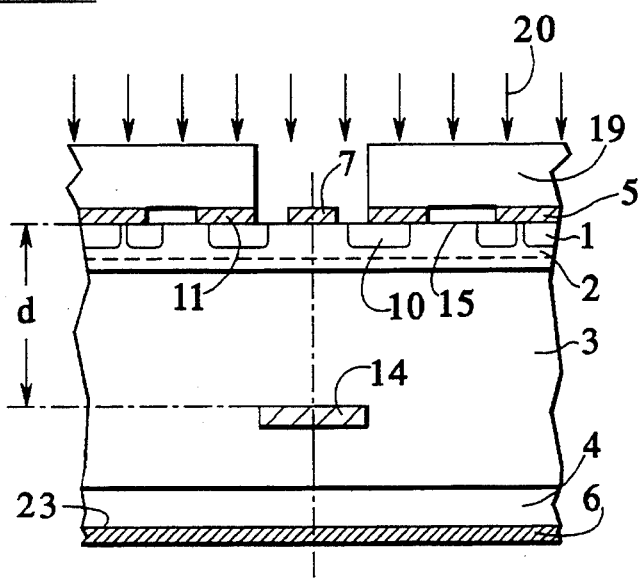
FIG. 2 shows a representation for explaining a process for manufacturing a simplified embodiment of the thyristor according to FIG. 1.

The manufacture of a thyristor according to the invention, which contains the zone 14 but not the zone 18, will now be described with reference to FIG. 2. This will be based on a thyristor of conventional construction, consisting of the parts 1 to 6, 10 and 11. The cathode-end main surface 15 is completely covered by a mask 19, for example of metal, outside a central area which is provided for the triggering contact 7 or for a light-sensitive thyristor zone in the case of a light-sensitive thyristor. The thyristor is then irradiated with charged particles, for example protons or helium cores, in the direction of the arrows 20. These are under the influence of an accelerating voltage, the magnitude of which is selected in such a manner that a kinetic energy is imparted to the particles which drives them into the semiconductor body to a depth of penetration corresponding to the distance d. At that depth, the zone 14 of the n-type base 3, enriched with generation and recombination centers, is then produced. The distance d is primarily determined by the magnitude of the accelerating voltage without the irradiated proton dose, which can be approximately $10^{10}$ per $cm^2$, playing a critical role.

Figure 3:
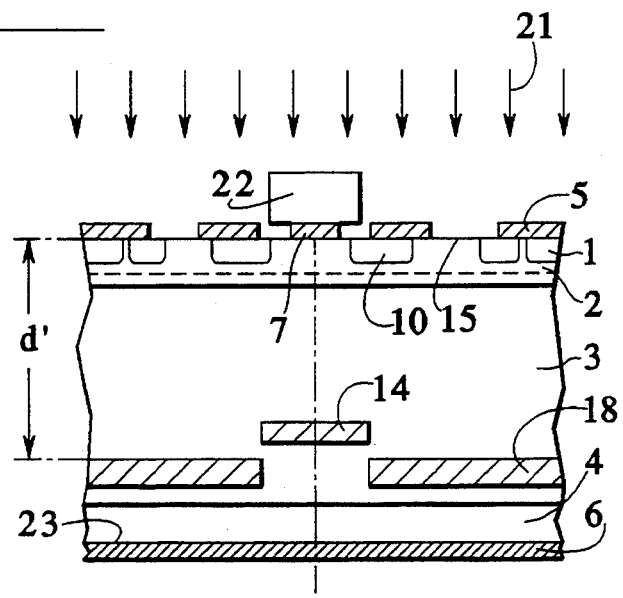
FIG. 3 shows a representation for explaining an additional process step for manufacturing the complete embodiment shown in FIG. 1.

If the thyristor manufactured in this manner is also to be provided with the zone 18, an additional irradiation of the thyristor with charged particles of the said type through its cathode-end main surface 15 is carried out according to FIG. 3 in a further process step which is indicated by the arrows 21. In this process, a mask 22, for example of metal, is used which has the inverse structure to the mask 19 and thus only covers the central part which is provided for a triggering contact 7 or for a light-sensitive thyristor zone. By using an accelerating voltage which is greater than that used for generating the zone 14, the charged particles penetrate deeper into the semiconductor body so that a zone 18 of the n-type base 3 is produced at a distance d' from the cathode-end main surface 15, which zone 18 is enriched with the charged particles. The zone 18 is then in the lateral area of the thyristor located outside the zone 14. The distance d' is greater than the distance d according to FIG. 2.

The process according to the invention, described above, can also be modified in such a manner that the irradiation of the thyristor with the charged particles is carried out through its anode-end main surface 23. In this process, the masks 19 and 22 are in each case used for covering the anode-end main surface 23 in FIGS. 2 and 3 and the directions of irradiation are correspondingly reversed so that the charged particles penetrate into the thyristor through the main surface 23. In this case, the accelerating voltage for generating the zone 14 is selected to be greater than that for generating the zone 18 in order to achieve the size relation of d and d' already described.

Figure 4:
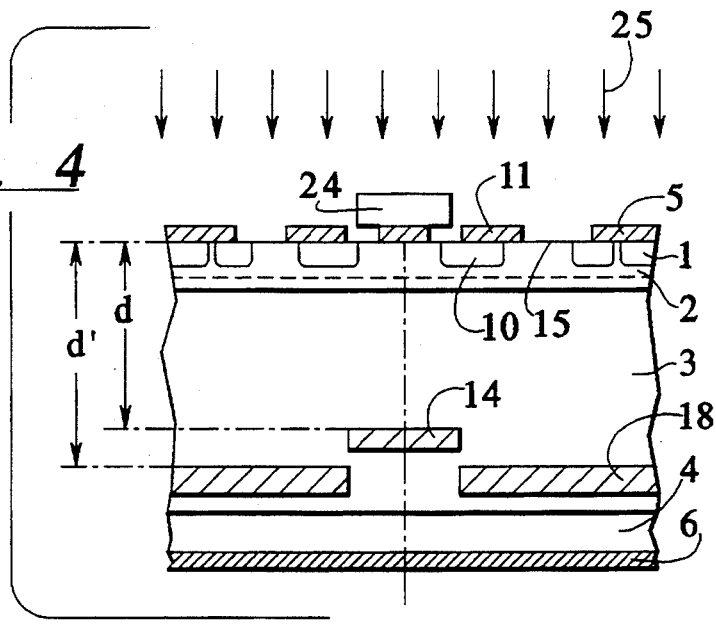
FIG. 4 shows another process for manufacturing the complete embodiment shown in FIG. 1.

Another process for manufacturing a thyristor according to the invention, which exhibits the zones 14 and 18, consists, according to FIG. 4, in that a thyristor containing the parts 1 to 6, 10 and 11 is used as a basis and a cathode-end irradiation of the whole area of the thyristor with charged particles, for example protons or helium cores, is carried out, the mask 22 of FIG. 3 being replaced by a shutter 24 corresponding to the latter in its lateral dimensions. This irradiation is indicated by the arrows 25. The charged particles are under the influence of an accelerating voltage which imparts to them such a kinetic energy that they reach a depth of penetration d' outside the lateral area of the shutter 24 and the zone 18 enriched with the charged particles is produced. At the same time, the shutter 24, when the charged particles impinge on it, absorbs such a proportion of the kinetic energy that the particles penetrating through the shutter 24 exhibit a residual kinetic energy by means of which they achieve a depth of penetration d. In this manner, the zone 14 is formed underneath the shutter 24 at a distance d from the cathode-end main surface 15.

Another process for manufacturing a thyristor according to the invention, with the zones 14 and 18, is described with reference to FIG. 5. It consists in that a thyristor containing the parts 1 to 6, 10 and 11 is irradiated over its whole area with the charged particles already described through its anode-end boundary face 23, which is indicated by the arrows 26. In this arrangement, a shutter 27 is provided which is inverse to the shutter 24, that is to say completely covers the entire lateral area outside a central area provided for the triggering contact 7 or for a light-sensitive thyristor zone. The charged particles are under the influence of an accelerating voltage which allows them to reach such a depth of penetration within this central area that the zone 14 is formed at a distance d from the cathode-end main surface. At the same time, the shutter 27, with the particles impinging on it, absorbs such a proportion of the kinetic energy that the particles penetrating through the shutter 27 exhibit a residual kinetic energy by means of which they achieve a depth of penetration which corresponds to the distance d' from the cathode-end main surface 15. This produces the zone 18 in the lateral area of the shutter 27.

Figure 5:
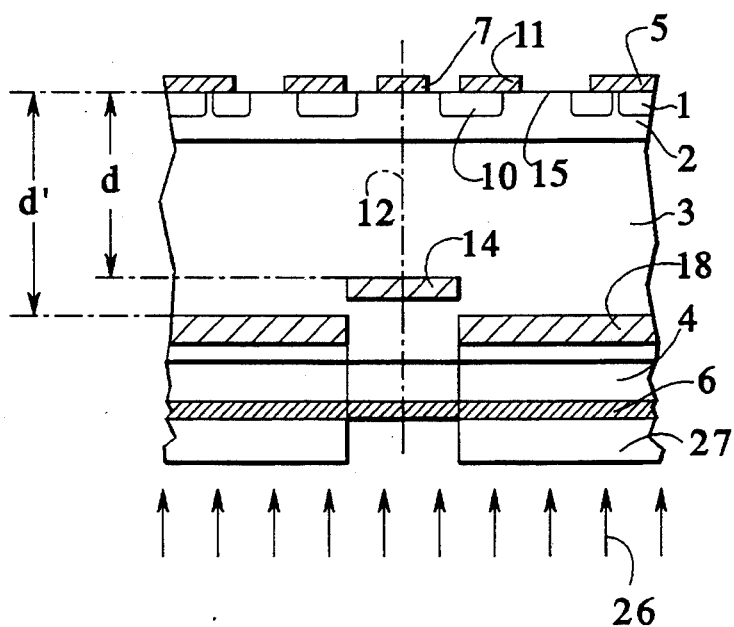
FIG. 5 shows another process for manufacturing the complete embodiment shown in FIG. 1.

If, in the process according to FIGS. 4 or 5, shutters 24 and 27, respectively, are provided which are manufactured from a semiconductor material which corresponds to the material of the semiconductor body, the desired size relation of d and d' can be advantageously achieved by the fact that the thickness of the shutters 24 and 27 corresponds to the difference d'–d.

The parts 10 and 11 used for internal amplification of the triggering can also be omitted in a thyristor according to the invention. Furthermore, the process step indicated in FIG. 3 can also be carried out before that indicated in FIG. 2 in the manufacture of the thyristor according to FIGS. 2 and 3.

What is claimed is:

1. A process for manufacturing a thyristor with a semiconductor body which exhibits an n-type emitter which is in contact with a cathode-end electrode with an adjoining p-type base and a p-type emitter which is in contact with an anode-end electrode with an adjoining n-type base which, in turn, is separated from the p-type base by means of a pn junction with a zone of the n-type base which is located in an area underneath a triggering contact or a light-sensitive thyristor zone, extends approximately in parallel with a cathode-end main surface, additionally exhibits generation and recombination centers and is arranged at a distance from the cathode-end main surface determining a value of a breakover voltage of the thyristor, comprising the steps of:
irradiating with charged particles at the cathode end the semiconductor body having the n-type emitter, the p-type base, the n-type base and the p-type emitter for the purpose of generating a zone of the n-type base and a further zone of the n-type base, said step of irradiating including,
covering with a shutter a central area of the cathode-end main surface,
accelerating the charged particles under influence of an accelerating voltage which imparts to them a kinetic energy determining a distance of the further zone from the cathode-end main surface, and
absorbing with the shutter such a proportion of the kinetic energy that the charged particles penetrating through the shutter exhibit a residual kinetic energy determining the distance of the zone of the n-type base from the cathode-end main surface which is smaller than the distance of the further zone from the cathode-end main surface.

2. A process for manufacturing a thyristor with a semiconductor body which exhibits an n-type emitter which is in contact with a cathode-end electrode with an adjoining p-type base and a p-type emitter which is in contact with an anode-end electrode with an adjoining n-type base which, in turn, is separated from the p-type base by means of a pn junction with a zone of the n-type base which is located in an area underneath a triggering contact or a light-sensitive thyristor zone, extends approximately in parallel with a cathode-end gain surface, additionally exhibits generation and recombination centers and is arranged at a distance from the cathode-end main surface determining a value of a breakover voltage of the thyristor, comprising the steps of:
irradiating with charged particles at the anode end the semiconductor body having the n-type emitter, the p-type base, the n-type base and the p-type emitter for the purpose of generating a zone of the n-type base and a further zone of the n-type base, said step of irradiating including
completely covering with a shutter with an opening at the center area of the anode end main surface outside a central area provided for the triggering contact or for a light-sensitive thyristor zone,
accelerating the charged particles under influence of an accelerating voltage which imparts to them a kinetic energy determining a distance of the zone of the n-type base from the cathode-end main surface, and
absorbing with the shutter such a proportion of the kinetic energy that the charged particles penetrating through the shutter exhibit a residual kinetic energy determining the distance of the further zone from the cathode end main surface, which is greater than the distance of the zone of the n-type base from the cathode-end main surface.

3. A process according to claim 1, wherein said shutter consists of a same semiconductor material as the semiconductor body, and said shutter is of a thickness which corresponds to a distance between the zone of the n-type base and the further zone of the n-type base.

4. A process for manufacturing a thyristor as claimed in claim 1, wherein the charged particles consist of protons or helium cores.

* * * * *